United States Patent
Hsieh et al.

(10) Patent No.: US 10,053,361 B2
(45) Date of Patent: Aug. 21, 2018

(54) METHOD OF SELECTIVELY REMOVING AN ANTI-STICTION LAYER ON A EUTECTIC BONDING AREA

(71) Applicant: Taiwan Semiconductor Manufacturing Co., Ltd., Hsin-Chu (TW)

(72) Inventors: Yuan-Chih Hsieh, Hsinchu (TW); Hung-Hua Lin, Taipei (TW); Wen-Chuan Tai, Hsinchu (TW); Hsiang-Fu Chen, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 79 days.

(21) Appl. No.: 14/583,269

(22) Filed: Dec. 26, 2014

(65) Prior Publication Data
US 2016/0185592 A1  Jun. 30, 2016

(51) Int. Cl.
*B81C 1/00* (2006.01)
*B81C 99/00* (2010.01)
(Continued)

(52) U.S. Cl.
CPC ........ *B81C 1/00841* (2013.01); *B81B 3/0005* (2013.01); *B81C 1/00269* (2013.01);
(Continued)

(58) Field of Classification Search
CPC . H01L 2224/80013; H01L 2224/80913; H01L 2224/81013; H01L 2224/81913; H01L 2224/83013; H01L 2224/83913; H01L 2224/84013; H01L 2224/84913; H01L 2224/85016; H01L 2224/85913; H01L 21/3065; H01L 21/32136; H01L 2924/1461; C23C 16/042; C23C 16/45563–16/4558; C23C 16/50–16/56; B81B 7/007; B81B 3/0005;
(Continued)

(56) References Cited

U.S. PATENT DOCUMENTS

| | | | |
|---|---|---|---|
| 6,261,406 B1 * | 7/2001 | Jurgensen | H01J 37/32623 156/345.3 |
| 8,728,845 B2 * | 5/2014 | Lin | B81B 3/0005 257/E21.254 |

(Continued)

*Primary Examiner* — Lauren R Bell
(74) *Attorney, Agent, or Firm* — Eschweiler & Potashnik, LLC (57) ABSTRACT

A microelectromechanical systems (MEMS) package includes a eutectic bonding structure free of a native oxide layer and an anti-stiction layer, while also including a MEMS device having a top surface and sidewalls lined with the anti-stiction layer. The MEMS device is arranged within a MEMS substrate having a first eutectic bonding substructure arranged thereon. A cap substrate having a second eutectic bonding substructure arranged thereon is eutectically bonded to the MEMS substrate with a eutectic bond at the interface of the first and second eutectic bonding substructures. The anti-stiction layer lines a top surface and sidewalls of the MEMS device, but not the first and second eutectic bonding substructures. A method for manufacturing the MEMS package and a process system for selective plasma treatment are also provided.

20 Claims, 6 Drawing Sheets

(51) Int. Cl.
*C23C 16/50* (2006.01)
*B81B 3/00* (2006.01)

(52) U.S. Cl.
CPC .......... *B81C 99/0025* (2013.01); *C23C 16/50* (2013.01); *B81C 2201/112* (2013.01); *B81C 2203/0109* (2013.01)

(58) Field of Classification Search
CPC .... B81B 2201/0264; B81B 2201/0235; B81B 2201/0242; B81B 2207/115; B81B 2207/096; B81C 1/00238; B81C 1/00301; B81C 99/0025; B81C 2201/112; B81C 2203/0109; B81C 1/00841; B81C 1/00269
See application file for complete search history.

(56) References Cited

U.S. PATENT DOCUMENTS

| | | | | |
|---|---|---|---|---|
| 9,054,121 | B2* | 6/2015 | Liu | H01G 5/16 |
| 2004/0224095 | A1* | 11/2004 | Miller | B05D 1/185 |
| | | | | 427/402 |
| 2005/0211384 | A1* | 9/2005 | Hayashi | C23C 4/12 |
| | | | | 156/345.47 |
| 2006/0221540 | A1* | 10/2006 | Himori | H01J 37/32082 |
| | | | | 361/234 |
| 2008/0277062 | A1* | 11/2008 | Koshimizu | H01J 37/32082 |
| | | | | 156/345.28 |
| 2012/0148870 | A1* | 6/2012 | Liu | B81C 1/00269 |
| | | | | 428/641 |
| 2013/0043510 | A1* | 2/2013 | Shu | B81C 1/00269 |
| | | | | 257/254 |
| 2013/0099355 | A1* | 4/2013 | Liu | H01G 5/16 |
| | | | | 257/532 |
| 2014/0256093 | A1* | 9/2014 | Lin | H01L 21/823431 |
| | | | | 438/157 |

* cited by examiner

METHOD OF SELECTIVELY REMOVING AN ANTI-STICTION LAYER ON A EUTECTIC BONDING AREA

BACKGROUND

Microelectromechanical systems (MEMS) devices, such as accelerometers, pressure sensors, and gyroscopes, have found widespread use in many modern day electronic devices. For example, MEMS accelerometers are commonly found in automobiles (e.g., in airbag deployment systems), tablet computers, or in smart phones. For many applications, MEMS devices are electrically connected to application-specific integrated circuits (ASICs) to form complete MEMS systems. Commonly, the connections are formed by wire bonding, but other approaches are also possible.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During the bulk manufacture of MEMS devices according to some methods, a MEMS wafer is arranged over and bonded to a complementary metal-oxide-semiconductor (CMOS) wafer having supporting logic for the MEMS devices thereon. Subsequently, a eutectic bonding substructure is formed over a top surface of the MEMS wafer, and the MEMS devices are formed within the MEMS wafer. Further, an anti-stiction layer is applied to all exposed surfaces to prevent stiction of movable components of the MEMS devices, and a cap wafer is bonded to the MEMS wafer using the eutectic bonding substructure for eutectic bonding. With the cap wafer bonded to the MEMS wafer, the wafers are singulated into dies, each including at least one MEMS device, and packaging is completed.

A challenge with manufacturing MEMS devices according to the foregoing methods pertains to eutectic bonding. Between forming the eutectic bonding substructure and bonding the cap wafer to the MEMS wafer, a native oxide layer grows on uncovered surfaces, including uncovered surfaces of the eutectic bonding substructure. Further, in applying the anti-stiction layer, uncovered surfaces of the eutectic bonding substructure are coated with the anti-stiction layer. Regions of the native oxide layer and the anti-stiction layer on the eutectic bonding substructure reduce the reliability of the eutectic bond, potentially leading to failure of the eutectic bond.

Prior solutions to address this challenge employ non-selective cleaning of the eutectic bonding substructure prior to eutectic bonding. Traditionally, thermal treatment is employed to at least partially remove regions of the anti-stiction layer on the eutectic bonding substructure, and ion bombardment is employed to remove the native oxide layer and any remaining regions of the anti-stiction layer on the eutectic bonding substructure. However, ion bombardment also removes regions of the anti-stiction layer lining top surfaces and sidewalls of the MEMS devices, thereby reducing or eliminating the effectiveness of the anti-stiction layer. Further, skipping the ion bombardment or changing the sequence reduces the reliability of the eutectic bond.

In view of the foregoing, the present disclosure is directed to an improved method of selectively removing regions of the anti-stiction layer and regions of the native oxide layer, on the eutectic bonding substructure. The improved method employs selective ion bombardment or plasma treatment to remove regions of the native oxide layer and the anti-stiction layer on the eutectic bonding substructure prior to eutectic bonding. This advantageously improves the reliability of the eutectic bond, while simultaneously improving the effectiveness of the anti-stiction layer. The present disclosure is also directed to the improved semiconductor structure or integrated circuit resulting from application of the method. The improved semiconductor structure or integrated circuit includes a eutectic bonding substructure free of the native oxide layer and the anti-stiction layer, while also including a MEMS device sidewalls and top surfaces are lined with the anti-stiction layer.

Figure 1:
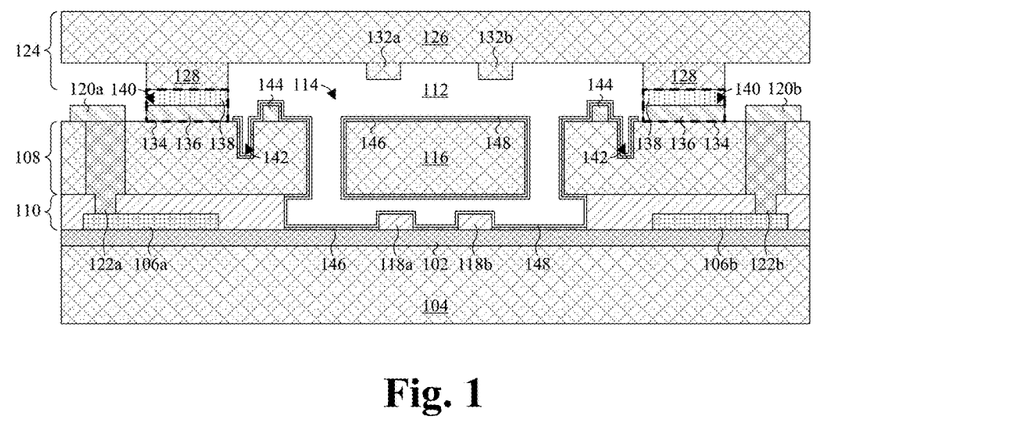
FIG. 1 illustrates a cross-sectional view of some embodiments of a microelectromechanical systems (MEMS) package including an anti-stiction layer coating a MEMS device, but not a eutectic bonding area between a MEMS substrate and a cap substrate.

With reference to FIG. 1, a cross-sectional view of some embodiments of a MEMS package 100 is provided. The MEMS package 100 can be part of a wafer-level structure (i.e., a semiconductor structure spanning multiple dies) before or after singulation, or part of a die-level structure (i.e., a semiconductor structure limited to a single die).

An IC 102 is arranged over and/or within an IC substrate 104. The IC 102 supports MEMS device operation and includes electronic components connected by interconnect components. The electronic components include, for example, one or more of transistors, capacitors, resistors, inductors, and diodes. The interconnect components include, for example, one or more of wires, traces, vias, and contacts. The IC 102 is, for example, an application-specific-integrated circuit (ASIC) and/or is, for example, formed according to a CMOS manufacturing process. The IC substrate 104 is, for example, a bulk substrate of silicon, germanium, or group III and group V elements. Alternatively, the IC substrate 104 is, for example, a semiconductor-on-insulator (SOI) substrate.

IC bond pads 106a, 106b are arranged over and in electrical communication with the IC 102. The IC bond pads 106 provide an electrical interface to the IC 102, and are or otherwise include, for example, metal, such as aluminum copper.

A MEMS substrate 108 is arranged over and bonded to the IC substrate 104 with an intersubstrate dielectric structure 110. The intersubstrate dielectric structure 110 is arranged between the MEMS substrate 108 and the IC substrate 104, and is arranged around a cavity 112 arranged over the IC substrate 104. The intersubstrate dielectric structure 110 provides spacing between the MEMS substrate 108 and the IC substrate 104, and facilitates bonding of the MEMS substrate 108 to the IC substrate 104, typically by a fusion bond. The intersubstrate dielectric structure 110 is or otherwise includes, for example, a dielectric, such as silicon dioxide, silicon nitride, or silicon oxynitride. The MEMS substrate 108 is, for example, a bulk substrate of silicon, germanium, or group III and group V elements. Alternatively, the MEMS substrate 108 is, for example, a semiconductor-on-insulator (SOI) substrate.

One or more MEMS devices 114 are arranged over and/or within the MEMS substrate 108. The MEMS devices 114 include, for example, one or more of motion sensors, such as gyroscopes or accelerometers, or pressure sensors. In some embodiments, the MEMS devices 114 include a movable component. For example, in the case of a motion sensing MEMS device, a movable proof mass 116 is arranged within the cavity 112 and employed to measure motion.

In some embodiments, bottom stoppers 118a, 118b are arranged over the IC substrate 104 in the cavity 112 between the MEMS devices 114 and the IC substrate 104. The bottom stoppers 118 stop MEMS device components, such as the proof mass 116, from overextending in the vertical direction towards the IC substrate 104. This advantageously reduces the likelihood of damage to the MEMS devices 114 and increases the useful life of the MEMS devices 114. The bottom stoppers 118 are or otherwise include, for example, a dielectric, such as silicon dioxide, silicon nitride, or silicon oxynitride.

MEMS bond pads 120a, 120b are arranged over the MEMS substrate 108 and electrically coupled to the IC bond pads 106 to provide an interface to the IC 102 from over the MEMS substrate 108. The MEMS bond pads 120 are electrically coupled to the IC bond pads 106 by vias 122a, 122b extending through the MEMS substrate 108, into the intersubstrate dielectric structure 110, to the IC bond pads. In some embodiments, the footprints of the vias discretely taper towards the IC substrate 104. The vias 122 electrically couple the MEMS bond pads 120 to the IC bond pads 106 with, for example, polysilicon or metal, such as tungsten, copper, or aluminum. The MEMS bond pads 120 are or otherwise include, for example, metal, such as aluminum copper.

A cap substrate 124 is arranged over and bonded to the MEMS substrate 108. The cap substrate 124 includes a base region 126 having a generally uniform thickness and a mounting region 128 extending vertically from the base region 126 around the cavity 112 over the MEMS devices 114. In some embodiments, the cap substrate 124 further includes or is otherwise associated with top stoppers 132a, 132b arranged in the cavity 112 between the MEMS devices 114 and the base region 126. The top stoppers 132 stop MEMS device components, such as the proof mass 116, from overextending in the vertical direction towards the cap substrate 124. This advantageously reduces the likelihood of damage to the MEMS devices 114 and increases the useful life of the MEMS devices 114. The cap substrate 124 is, for example, a bulk substrate of silicon, germanium, or group III and group V elements. Alternatively, the cap substrate 124 is, for example, a semiconductor-on-insulator (SOI) substrate. The top stoppers 132 are or otherwise include, for example, a dielectric, such as silicon dioxide, silicon nitride, or silicon oxynitride.

A eutectic bonding structure 134 bonds the cap substrate 124 to the MEMS substrate 108. The eutectic bonding structure 134 includes a first eutectic bonding substructure 136 arranged on a top surface of the MEMS substrate 108 around the periphery of the cavity 112, a second eutectic bonding substructure 138 arranged on a bottom surface of the mounting region 128 around the periphery of the cavity 112, and a eutectic bond 140 at the interface between the first and second eutectic bonding substructure 136, 138. In some embodiments, the first and second eutectic bonding substructures 136, 138 have rectangular, ring shapes with widths and lengths respectively of about 40-100 micrometers and about 800-2000 micrometers. The first and second eutectic bonding substructures 136, 138 are or otherwise include, for example, aluminum copper, germanium, aluminum germanium, gold silicon, and gold germanium. For example, the first eutectic bonding substructure 136 can be or otherwise include aluminum copper, and the second eutectic bonding substructure 138 can be or otherwise include germanium. In other embodiments, alternatives to eutectic bonding can be employed to bond the cap substrate 124 to the MEMS substrate 108. Such other approaches include, for example, thermal compressive bonding (e.g., between aluminum bonding substructures, copper bonding substructures, aluminum and silicon bonding substructures, titanium and silicon bonding substructures, etc.) and solid-liquid interdiffusion bonding (e.g., between copper and tin bonding substructures, germanium and tin bonding substructures, etc.).

In some embodiments, a trench 142 and/or a barrier 144 are arranged within the cavity 112 around the periphery of the cavity 112 to prevent material from the eutectic bonding structure 134 from moving laterally towards the center of the cavity 112 when the first and second bonding substructures 136, 138 are squished together. When the two substructures 136, 138 are squished together, any material moving laterally towards the center of the cavity 112 falls into the trench 142 and/or is blocked by the barrier 144. The barrier 144 is or otherwise includes, for example, aluminum copper.

A native oxide layer 146 and an anti-stiction layer 148 line regions of the interior of the cavity 112 from the MEMS substrate 108 to the IC substrate 104. The native oxide layer 146 grew during the period between bonding the cap substrate 124 to the MEMS substrate 108, and the anti-stiction layer 148 was formed to prevent stiction of movable components, such as the proof mass 116, of the MEMS devices 114. Advantageously, the native oxide layer 146 and the anti-stiction layer 148 do not line the bonding substructures 136, 138 and/or otherwise interfere with the eutectic bond 140. This, in turn, improves the reliability of the eutectic bond 140. Further, the anti-stiction layer 148 advantageously lines top surfaces and sidewalls of the MEMS devices 114 to reduce stiction. As described above, the native oxide layer 146 and the anti-stiction layer 148 traditionally interfere with the eutectic bond 140, or are otherwise removed from top surfaces and sidewalls of the MEMS devices 114, thereby reducing the effectiveness of the anti-stiction layer 148.

Figure 2:
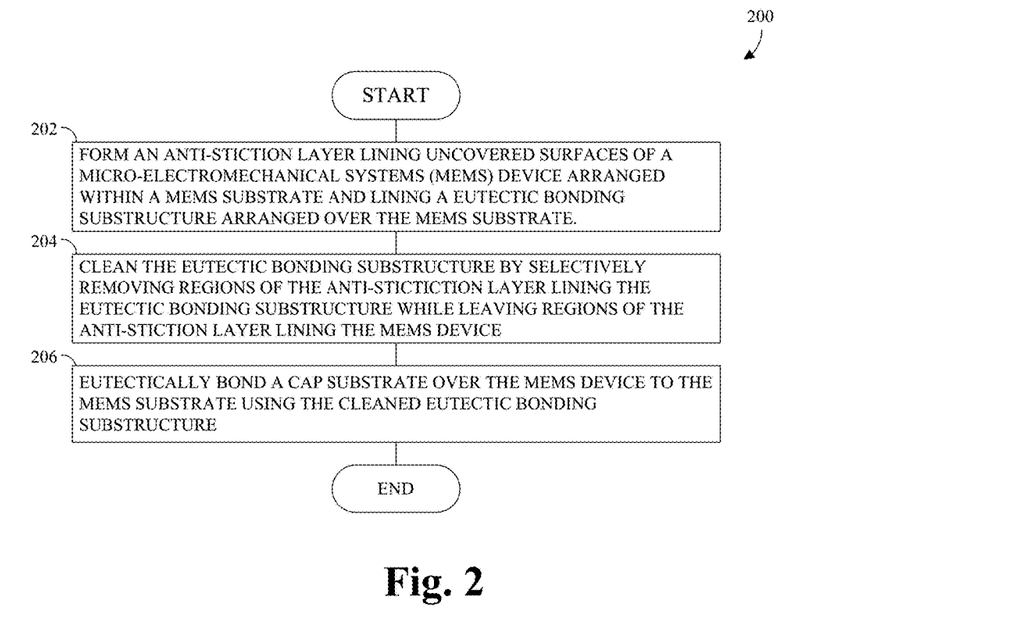
FIG. 2 illustrates a flow chart of some embodiments of a method for manufacturing a MEMS package with an anti-stiction layer coating a MEMS device, but not a eutectic bonding area between a MEMS substrate and a cap substrate.

With reference to FIG. 2, a flow chart 200 provides some embodiments of a method for manufacturing a MEMS package with an anti-stiction layer coating a MEMS device, but not a eutectic bonding area between a MEMS substrate and a cap substrate. An example of the MEMS package is shown in FIG. 1.

According to the method, an anti-stiction layer is formed (Action 202) lining uncovered surfaces of a MEMS device arranged within a MEMS substrate and lining a eutectic bonding substructure (more generally, a eutectic bonding area) arranged over the MEMS substrate.

The eutectic bonding substructure or area is cleaned (Action 204) by selectively removing regions of the anti-stictiction layer lining the eutectic bonding substructure or area while leaving regions of the anti-stiction layer lining the MEMS device.

A cap substrate is eutectically bonded (Action 206) over the MEMS device to the MEMS substrate using the cleaned eutectic bonding substructure or area.

While the disclosed methods (e.g., the method described by the flowchart 200) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 3:
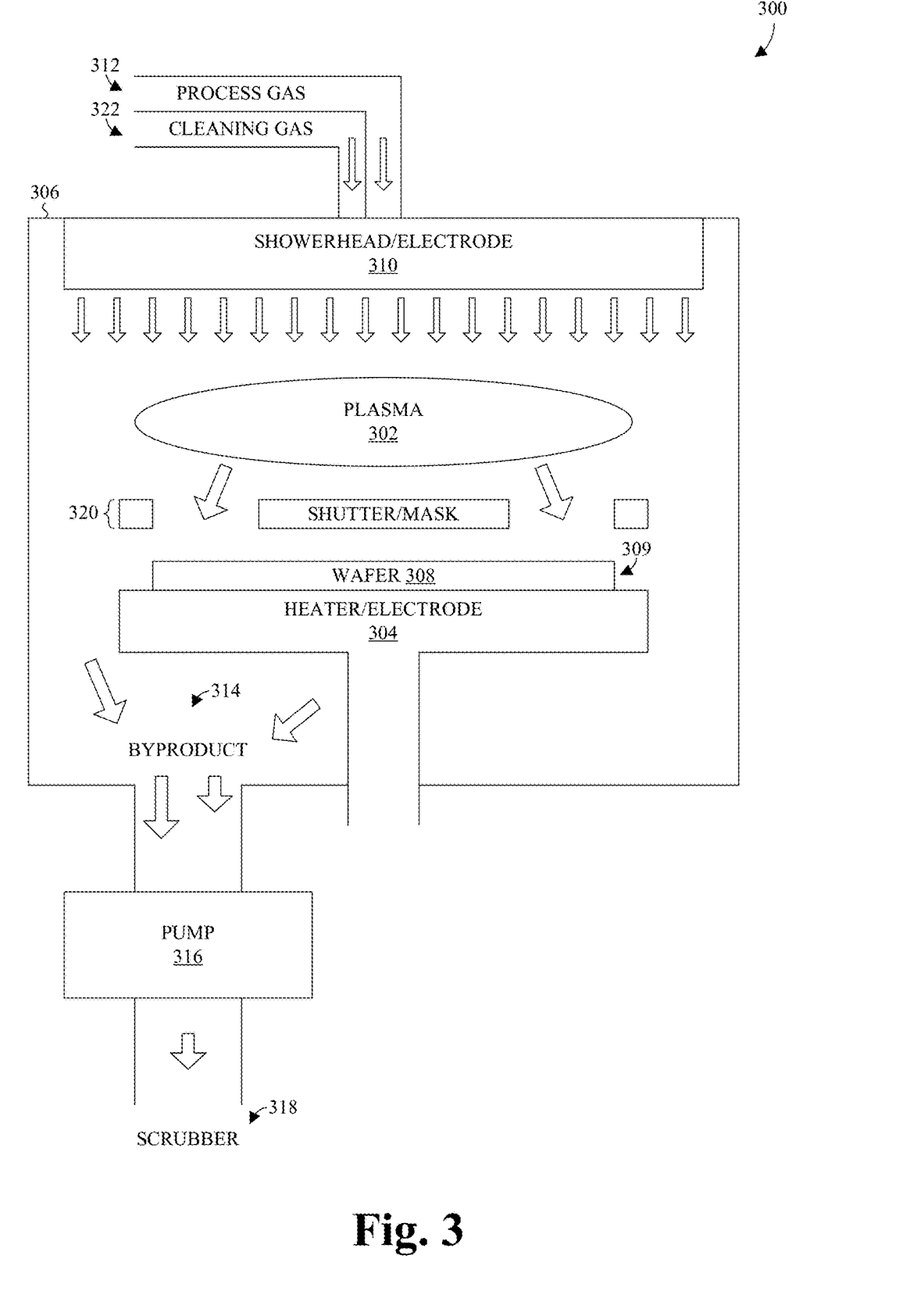
FIG. 3 illustrates a cross-sectional view of some embodiments of a process system for selectively removing regions of an anti-stiction layer coating a eutectic bonding area.

With reference to FIG. 3, a cross-sectional view 300 of some embodiments of a process system that can be employed with the method of FIG. 2 is provided. The process system selectively removes regions of an anti-stiction layer using plasma 302 (i.e., ion bombardment) and/or performs other selective plasma treatments. Such other selective plasma treatments include, for example, material surface property change and self-assembly by applying different surface energies.

A heater 304 is arranged within a plasma chamber 306 to provide thermal energy according to a process recipe and to support a wafer 308 within a support region 309. The plasma chamber 306 houses plasma 302 employed for selective plasma treatment. The plasma 302 is a gas that includes a substantial percentage of atoms or molecules that are ionized. The plasma 302 is generally formed by applying an electric field between electrodes 304, 310 in the presence of a process gas 312. In some embodiments, the electrodes 304, 310 correspond to the heater 304 and a showerhead 310. The process gas 312 fills the void or space between the electrodes 304, 310 and the electric field creates the plasma 302 from the process gas 312. In one example, the electric field is a radio frequency (RF) or alternating current (AC) frequency based electric field. In another example, the electric filed is a direct current (DC) field The process gas 312 is introduced into the plasma chamber 306 by an external pump (not shown) or similar mechanism. The process gas 312 flows into the space between the electrodes 304, 310 through the showerhead 310, which includes a series of outlet ports (not shown) for adequately dispersing the process gas 312. The process gas 312 can include a suitable precursor gas, such as dichlorosilane or silane and oxygen precursors, at suitable pressures. The process gas 312 flows about the plasma chamber 306 and exits at an exit port 314 as a byproduct. A pump 316 pulls or vacuums the byproduct from the plasma chamber 306 at a selected removal rate. The byproduct can then be transferred to a scrubber 318 for cleaning and/or removal.

A shutter/mask 320 includes a shutter and/or a mask arranged in the plasma chamber 306 to limit exposure of the wafer 308 to the plasma 302. In some embodiments, the shutter/mask 320 is arranged between the electrodes 304, 310, typically in close proximity to the wafer 308. In other embodiments, the shutter/mask 320 is arranged on one of the showerhead electrode 310 and the wafer 308. The shutter/mask 320 includes one or more openings or through holes defining a pattern limiting where the plasma 302 interacts with the wafer 308 for selective plasma treatment. In some embodiments, the openings or through holes include a rectangular, ring-shaped opening having a length and a width corresponding to a eutectic bonding ring. The width (shown as extending between the left and right sides of FIG. 3) is, for example, about 40-100 micrometers, and the length is, for example, about 800-2000 micrometers. The shutter allows these openings to be mechanically or dynamically varied, whereas the mask is static. The mask is or otherwise includes, for example, glass, such as pyrex.

In some embodiments, after exposing the wafer 308 to the plasma 302, a cleaning gas 322 is used to remove any molecules or atoms from the process gas 312 and to remove any other residual materials from the plasma chamber 306. The cleaning gas 322 flows through the showerhead 310, through the plasma chamber 306, and leaves at the exit port 314.

Figure 4:
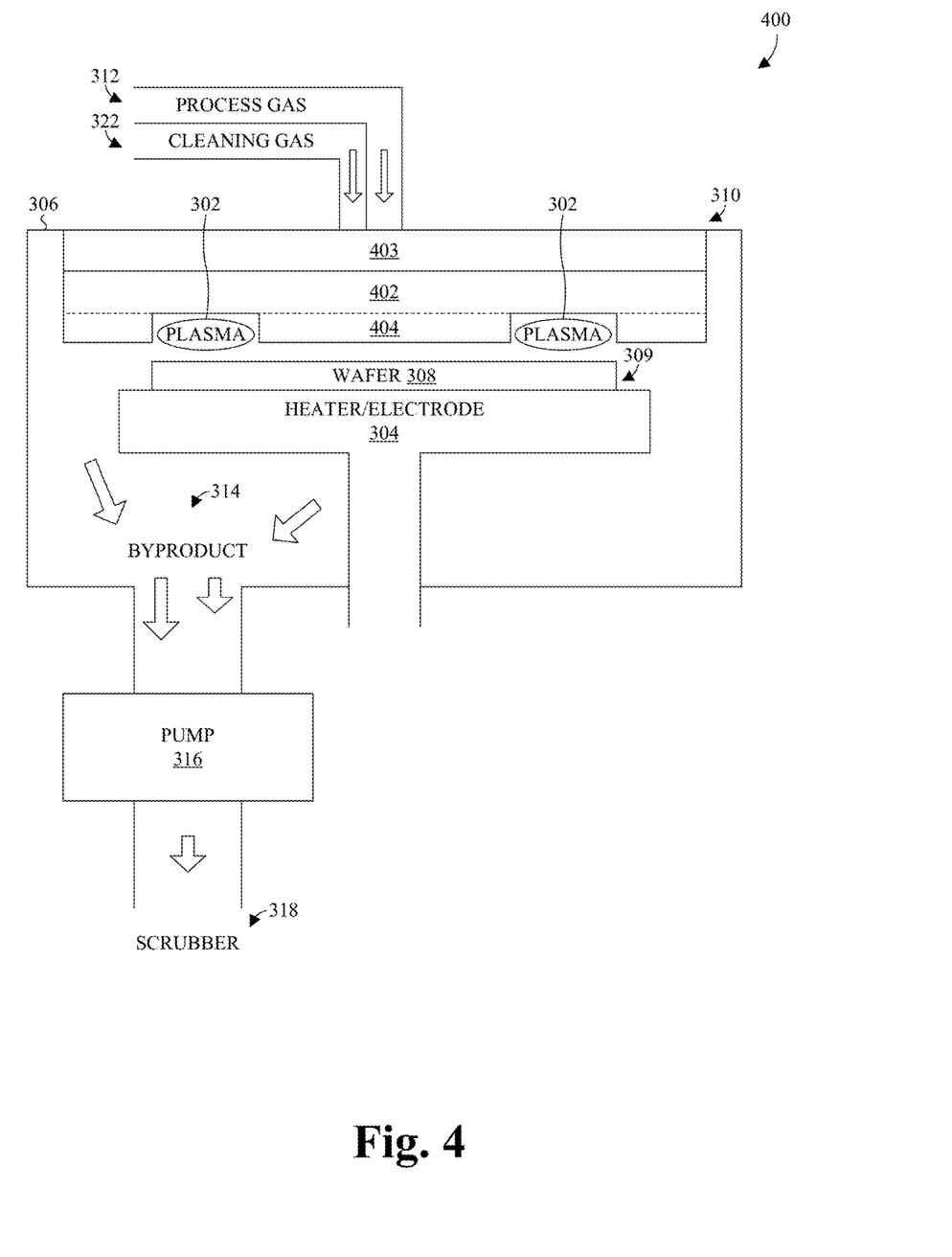
FIG. 4 illustrates a cross-sectional view of alternative embodiments of a process system for selectively removing regions of an anti-section layer coating a eutectic bonding area.

With reference to FIG. 4, a cross-sectional view 400 of alternative embodiments of the process system is provided. In contrast with the embodiments of FIG. 3, the alternative embodiments lack the shutter/mask 320. Further, the showerhead electrode 310 is removably arranged within the plasma chamber 306 and patterned to limit the formation of the plasma 302 to select regions of the plasma chamber 306 according to a pattern. This, in turn, limits exposure of the wafer 308 to the plasma 302 according to the pattern. In some embodiments, the showerhead electrodes 310 is also spaced about 100 to 200 micrometers from the wafer 308.

The showerhead electrode 310 includes a base layer 402 having a conductive layer 403 and a patterned layer 404 arranged on opposite sides of the base layer 402. The base layer 402 corresponds to an electrode substrate and typically has uniform thickness. The conductive layer 403 is employed to generate an electric field within the plasma chamber 306, and the patterned layer 404 includes the pattern for selective plasma treatment to modify the electric field according to the pattern. For example, a recess or opening in the patterned layered 404 includes a rectangular, ring shape having a length and a width corresponding to a eutectic bonding ring. The width (shown as extending between the left and right sides of FIG. 4) is, for example, about 40-100 micrometers, and the length is, for example, about 800-2000 micrometers. In some embodiments, the patterned layer 404 corresponds to a patterned dielectric layer independent of the base layer 402 that is arranged below the base layer 402 opposite the conductive layer 403. These embodiments advantageously allow quick and cost-effective changes between electrode patterns. In other embodiments, the patterned layer 404 corresponds to a patterned region of the electrode substrate. These embodiments advantageously eliminate or otherwise reduce contamination of the plasma chamber 306 from the patterned dielectric layer. The base layer 402 is or otherwise includes, for example, glass, such as pyrex, the conductive layer 403 is or otherwise includes, for example, a metal or doped polysilicon, and the patterned dielectric layer is or otherwise includes, for example, silicon dioxide, silicon nitride, silicon oxynitride, or photoresist.

With reference to FIGS. 5-9, cross-sectional views of some embodiments of a semiconductor structure or integrated circuit at various stages of manufacture are provided to illustrate the method. Although FIGS. 5-9 are described in relation to the method, it will be appreciated that the structures disclosed in FIGS. 5-9 are not limited to the method, but instead may stand alone as structures independent of the method. Similarly, although the method is described in relation to FIGS. 5-9, it will be appreciated that the method is not limited to the structures disclosed in FIGS. 5-9, but instead may stand alone independent of the structures disclosed in FIGS. 5-9.

Figure 5:
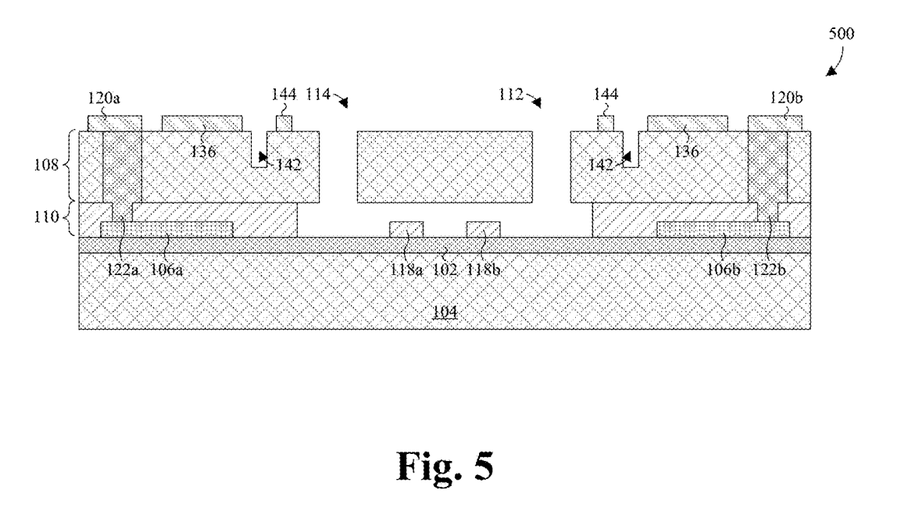
FIGS. 5-9 illustrate a series of cross-sectional views of some embodiments of a MEMS package at various stages of manufacture, the MEMS package including an anti-stiction layer coating a MEMS device, but not a eutectic bonding area between a MEMS substrate and a cap substrate.
Figure 6:
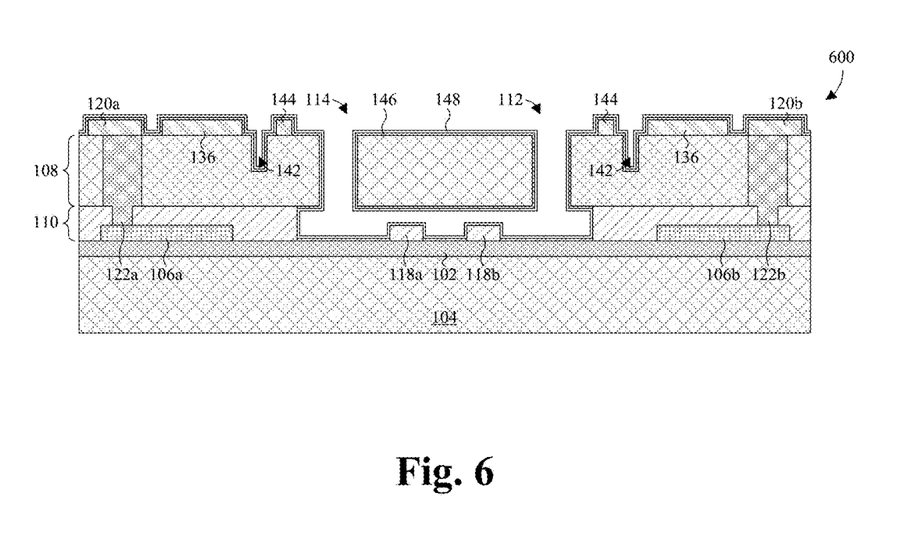

FIGS. 5 and 6 illustrate cross-sectional views 500, 600 of some embodiments corresponding to Action 602.

As shown by FIG. 5, a MEMS package at an intermediate stage of manufacture is provided. An IC 102 of the intermediate MEMS package is arranged over and/or within an IC substrate 104 of the intermediate MEMS package. The IC 102 is, for example, an application-specific-integrated circuit (ASIC) and/or is, for example, formed according to a CMOS manufacturing process. IC bond pads 106a, 106b of the intermediate MEMS package are arranged over and in electrical communication with the IC 102.

A MEMS substrate 108 of the intermediate MEMS package is arranged over and bonded to the IC substrate 104 with an intersubstrate dielectric structure 110 of the intermediate MEMS package arranged therebetween. The intersubstrate dielectric structure 110 surrounds a cavity 112 and provides spacing between the MEMS substrate 108 and the IC substrate 104. One or more MEMS devices 114 of the intermediate MEMS package are arranged over and/or within the MEMS substrate 108. In some embodiments, bottom stoppers 118a, 118b of the intermediate MEMS package are arranged over the IC substrate 104 in the cavity 112 between the MEMS devices 114 and the IC substrate 104. MEMS bond pads 120a, 120b of the intermediate MEMS package are arranged over the MEMS substrate 108 and electrically coupled to the IC bond pads 106 by vias 122a, 122b.

A first eutectic bonding substructure 136 of the intermediate MEMS package is arranged on a top surface of the MEMS substrate 108 around the periphery of the cavity 112. In some embodiments, the first eutectic bonding substructure 136 has a rectangular, ring shape with a width and a length respectively of about 40-100 micrometers and about 800-2000 micrometers. The first eutectic bonding substructure 136 is or otherwise includes, for example, aluminum copper. Alternatively, the first eutectic bonding substructure 136 is or otherwise includes, for example, germanium, aluminum germanium, gold silicon, or gold germanium. In some embodiments, a trench 142 of the intermediate MEMS package and/or a barrier 144 of the intermediate MEMS package are arranged over and/or within the MEMS substrate 108 around the periphery of the cavity 112 between the MEMS devices 114 and the first eutectic bonding substructure 136.

As shown by FIG. 6, an anti-stiction layer 148 is formed over uncovered surfaces, such as uncovered surfaces of the MEMS devices 114 and uncovered surfaces of the first eutectic bonding substructure 136. Typically, the anti-stiction layer 148 is a conformally formed, self-assembled monolayer. Also shown by FIG. 6, before forming the anti-stiction layer 148, a native oxide layer 146 forms, typically conformally, on uncovered surfaces. Although not shown in FIG. 5, it is to be appreciated that the native oxide layer 146 can also grow and/or otherwise exist on uncovered surfaces of this figure.

Figure 7:
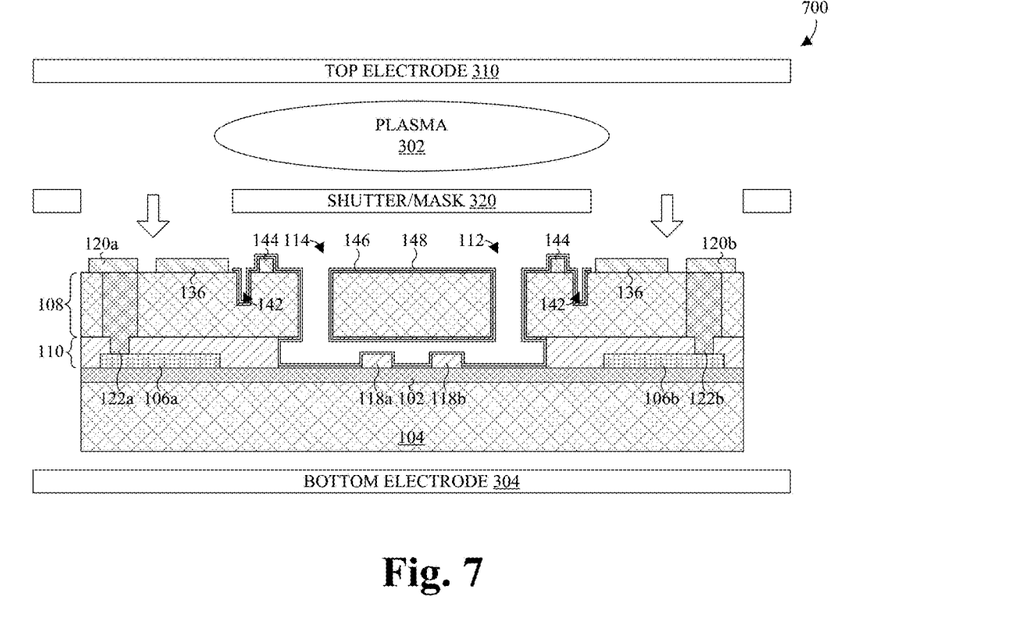
Figure 8:
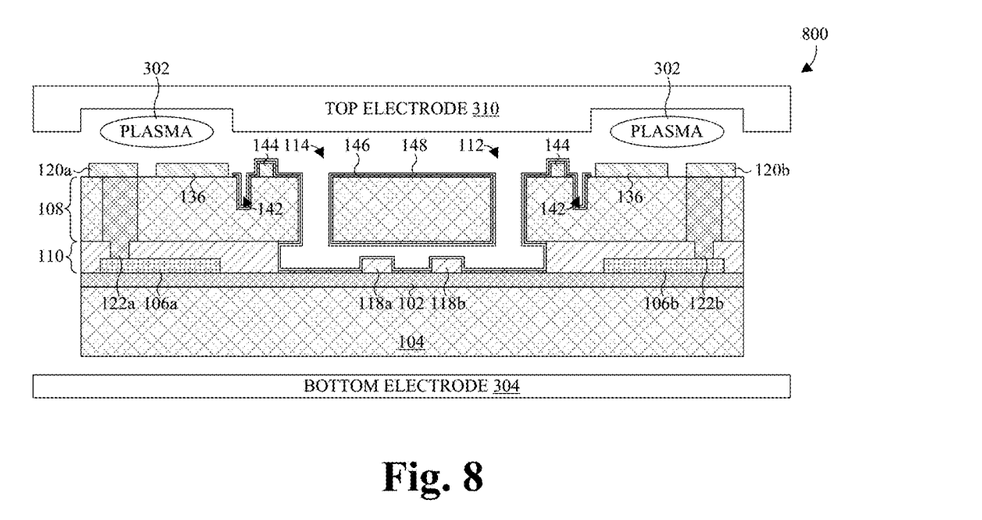

FIG. 7 illustrates a cross-sectional view 700 of some embodiments corresponding to Action 604, and FIG. 8 illustrates a cross-section view 800 of alternative embodiments corresponding to Action 604.

As shown by FIGS. 7 & 8, regions of the native oxide layer 146 and the anti-stiction layer 148 over the first eutectic bonding substructure 136 are removed, while leaving regions of the native oxide layer 146 and the anti-stiction layer 148 over the MEMS devices 114. Typically, the removal is performed by selective ion bombardment or plasma treatment. FIGS. 3 and 4 illustrate examples of a process system that can be employed to achieve such selective ion bombardment or plasma treatment.

In some embodiments, as shown by FIG. 7, the semiconductor structure is arranged between top and bottom electrodes 310, 304, which form plasma 302 over the semiconductor structure. The plasma then selectively passes through a shutter/mask 320 to the semiconductor structure for selective removal of regions of the native oxide layer 146 and the anti-stiction layer 148 over the first eutectic bonding substructure 136, while leaving regions of the native oxide layer 146 and the anti-stiction layer 148 over the MEMS devices 114. In some embodiments, the shutter/mask 320 includes a rectangular, ring-shaped opening aligned with, and having a length and a width corresponding to, the first eutectic bonding substructure 136. The width (shown as extending between the left and right sides of FIG. 7) is, for example, about 40-100 micrometers, and the length is, for example, about 800-2000 micrometers.

In other embodiments, as shown by FIG. 8, the semiconductor structure is arranged between a top, patterned electrode 310 and a bottom electrode 304. The top electrode 310 is, for example, spaced about 100 to 200 micrometers from the semiconductor structure. The electrodes 304, 310 selectively form plasma 302 over the semiconductor structure according to the pattern of the top electrode 310. For example, the plasma selectively forms in a recess of the top electrode 310 having a rectangular, ring shape corresponding the first eutectic bonding substructure 136. The width of the recess (shown as extending between the left and right sides of FIG. 8) is, for example, about 40-100 micrometers, and the length of the recess is, for example, about 800-2000 micrometers. The plasma 302 then interfaces with the semiconductor structure for selective removal of regions of the native oxide layer 146 and the anti-stiction layer 148 over the first eutectic bonding substructure 136, while leaving regions of the native oxide layer 146 and the anti-stiction layer 148 over the MEMS devices 114.

Advantageously, the effectiveness of the anti-stiction layer 148 is improved because regions coating the MEMS devices 114 persist after cleaning the first eutectic bonding substructure 136 of the native oxide layer 146 and the anti-stiction layer 148. This is to be contrasted with known solutions to cleaning the first eutectic bonding substructure 136

Figure 9:
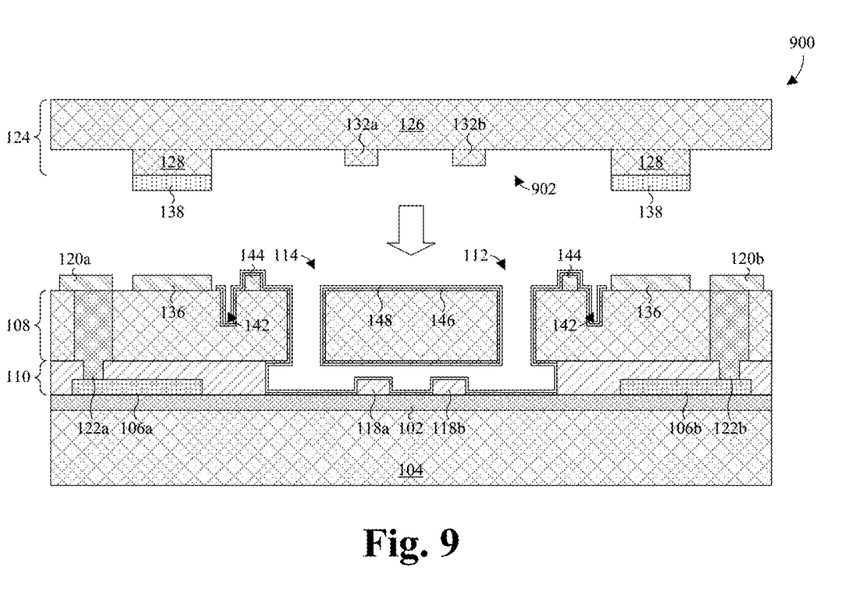

FIG. 9 illustrates a cross-sectional view 900 of some embodiments corresponding to Action 606.

As shown by FIG. 9, a cap structure is provided. A cap substrate 124 of the cap structure includes a base region 126 having a generally uniform thickness and a mounting region 128 extending vertically from the base region 126 around a central region 902. In some embodiments, the cap substrate 124 further includes or is otherwise associated with top stoppers 132a, 132b arranged in the central region 902. A second eutectic bonding substructure 138 of the cap structure is arranged on a bottom surface of the mounting region 128 around the periphery the central region 902. In some embodiments, second eutectic bonding substructure 138 has a rectangular, ring shape with a width and a length respectively of about 40-100 micrometers and about 800-2000 micrometers. The second eutectic bonding substructure 138 is or otherwise includes, for example, germanium. Alternatively, the second eutectic bonding substructure 138 is or otherwise includes, for example, aluminum copper, aluminum germanium, gold silicon, or gold germanium.

Also shown by FIG. 8, the cap structure is bonded to the MEMS substrate 108 and the cavity 112 is sealed by forming a eutectic bond at the interface between the first and second bonding substructures 138, 138. Advantageously, because the first eutectic bonding substructure 136 is free of the native oxide layer and/or the anti-stiction layer, the reliability of the eutectic bond is improved.

Thus, as can be appreciated from above, the present disclosure provides a MEMS package. A MEMS substrate has a MEMS device arranged therein and a eutectic bonding substructure arranged thereon. A cap substrate is arranged over the MEMS device and eutectically bonded to the MEMS substrate through the eutectic bonding substructure. An anti-stiction layer lines a top surface and sidewalls of the MEMS device, but not the eutectic bonding substructure.

In other embodiments, the present disclosure provides a method for manufacturing a MEMS package. An anti-stiction layer is formed lining uncovered surfaces of a MEMS device arranged within a MEMS substrate and lining a eutectic bonding substructure arranged on the MEMS substrate. The eutectic bonding substructure is cleaned by selectively removing regions of the anti-stiction layer lining the eutectic bonding substrate while leaving regions of the anti-stiction layer lining the MEMS device. A cap substrate is eutectically bonded over the MEMS device to the MEMS substrate using the cleaned eutectic bonding substructure.

In yet other embodiments, the present disclosure provides a process system. A plasma chamber has a support structure configured to support a wafer within the plasma chamber in a support region over the support structure. A first electrode and a second electrode are arranged in the plasma chamber. The first and second electrodes are configured to form plasma in the plasma chamber. In some embodiments, a shutter/mask is arranged in the plasma chamber between the first and second electrodes and configured to selectively expose the wafer to the plasma. The support region is arranged between the shutter/mask and the first electrode. In other embodiments, a patterned electrode corresponds to the second electrode. The first and patterned electrodes are arranged on opposing sides of the support region, and the patterned electrode is configured to selectively form plasma in the plasma chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a microelectromechanical systems (MEMS) package, the method comprising:
   forming an anti-stiction layer lining uncovered surfaces of a MEMS device arranged within a MEMS substrate and lining a eutectic bonding substructure arranged on the MEMS substrate;
   forming a top electrode comprising a conductive layer, an electrode substrate under and contacting the conductive layer, and an electrode dielectric layer under and contacting the electrode substrate, wherein the conductive layer has outermost conductive layer sidewalls, the electrode substrate has outermost electrode substrate sidewalls, and the electrode dielectric layer has outermost electrode dielectric layer sidewalls, wherein the outermost conductive layer sidewalls, the outermost electrode substrate sidewalls, and the outermost electrode dielectric layer sidewalls are outermost and coplanar when viewed in cross-section, wherein forming the top electrode comprises forming the electrode dielectric layer with a pattern, and wherein forming the top electrode comprises forming the electrode dielectric layer as photoresist and the electrode substrate as glass;
   cleaning the eutectic bonding substructure by selectively removing regions of the anti-stiction layer lining the eutectic bonding substructure while leaving regions of the anti-stiction layer lining the MEMS device, wherein the cleaning comprises selectively forming plasma in a plasma chamber according to the pattern of the electrode dielectric layer using the top electrode and an underlying bottom electrode; and
   eutectically bonding a cap substrate over the MEMS device to the MEMS substrate using the cleaned eutectic bonding substructure.

2. The method according to claim 1, further including:
   cleaning the eutectic bonding substructure by further selectively removing regions of a native oxide layer lining the eutectic bonding substructure while leaving regions of the native oxide layer lining the MEMS device.

3. The method according to claim 1, further including:
   forming the MEMS device within a cavity arranged between the MEMS substrate and the cap substrate; and
   forming the eutectic bonding substructure around a periphery of the cavity.

4. The method according to claim 3, further including:
bonding an integrated circuit (IC) substrate below the MEMS substrate; and
forming the cavity between the IC substrate, the MEMS substrate, and the cap substrate.

5. The method according to claim 1, further including:
forming MEMS bond pads over a top surface of the MEMS substrate, laterally spaced from the eutectic bonding substructure; and
cleaning the MEMS bond pads by selectively removing regions of the anti-stiction layer lining the MEMS bond pads while leaving regions of the anti-stiction layer lining the MEMS device.

6. The method according to claim 1, further including:
bonding an integrated circuit (IC) substrate below the MEMS substrate;
forming IC bond pads on the IC substrate;
forming through silicon vias (TSVs) extending through the MEMS substrate, from a top surface of the MEMS substrate, and electrically coupling to corresponding ones of the IC bond pads; and
forming MEMS bond pads corresponding to and electrically coupled to the TSVs over the top surface of the MEMS substrate.

7. The method according to claim 1, further comprising:
forming the anti-stiction layer covering a top surface of the MEMS device and a top surface of the eutectic bonding substructure, wherein the cleaning comprises removing the anti-stiction layer from the top surface of the eutectic bonding substructure without removing the anti-stiction layer from the top surface of the MEMS device.

8. The method according to claim 1, further comprising:
forming the top electrode with outer sidewalls between which the conductive layer, the electrode substrate, and the electrode dielectric layer are arranged, wherein the outer sidewalls of the top electrode are shared by the conductive layer, the electrode substrate, and the electrode dielectric layer; and
positioning the top electrode within the plasma chamber with the outer sidewalls laterally spaced from sidewalls of the plasma chamber.

9. The method according to claim 1, wherein forming the electrode dielectric layer with the pattern comprises forming a recess on a bottom of the electrode dielectric layer, wherein the recess is formed with opposite sidewalls extending continuously from a bottom surface of the electrode dielectric layer to a top surface of the electrode dielectric layer, and wherein the recess is formed with a top surface extending continuously from one of the opposite sidewalls to another one of the opposite sidewalls.

10. A method for manufacturing a microelectromechanical systems (MEMS) package, the method comprising:
forming an anti-stiction layer covering a top surface of a MEMS device arranged in a substrate, and further covering a top surface of a conductive structure arranged over the substrate and spaced from the MEMS device;
forming a top electrode comprising a conductive layer, an electrode substrate, and an electrode dielectric layer, wherein the electrode substrate is arranged between and contacting the conductive layer and the electrode dielectric layer, wherein the conductive layer has a pair of opposite conductive layer sidewalls, the electrode substrate has a pair of opposite electrode substrate sidewalls, and the electrode dielectric layer has a pair of opposite electrode dielectric layer sidewalls, wherein the opposite conductive layer sidewalls are respectively even with the opposite electrode substrate sidewalls, wherein the opposite electrode substrate sidewalls are respectively even with the opposite electrode dielectric layer sidewalls, wherein forming the top electrode comprises patterning the electrode dielectric layer to form a recess on a bottom of the top electrode, wherein the recess is formed with opposite sidewalls extending continuously from a bottom surface of the electrode dielectric layer to a bottom surface of the electrode substrate that is spaced between a top surface of the electrode substrate and the bottom surface of the electrode dielectric layer, wherein the bottom surface of the electrode substrate extends from one of the opposite sidewalls of the recess to another one of the opposite sidewalls of the recess, and wherein the bottom surface of the electrode substrate completely covers the recess when viewed in cross-section; and
removing the anti-stiction layer from the top surface of the conductive structure, while leaving the anti-stiction layer covering the top surface of the MEMS device, using the top electrode and an underlying bottom electrode to selectively generate plasma in a plasma chamber.

11. The method according to claim 10, wherein the conductive structure is a eutectic bond structure, and wherein the method further comprises:
eutectically bonding a cap substrate to the eutectic bonding structure, such that the cap substrate covers the MEMS device.

12. The method according to claim 10, wherein forming the top electrode comprises patterning the electrode dielectric layer to form the recess with a ring shape that extends laterally to enclose a central region of the top electrode, and wherein removing the anti-stiction layer comprises:
positioning the substrate in the plasma chamber, between the top electrode and the underlying bottom electrode, such that the conductive structure directly underlies the recess and the MEMS device directly underlies the central region; and
exposing the conductive structure to the plasma without exposing the MEMS device to the plasma, wherein the plasma is localized to directly between the recess and the conductive structure.

13. The method according to claim 10, wherein the method further comprises:
forming the top electrode with outer sidewalls that are shared by the conductive layer and the electrode substrate, and that are separate from the opposite sidewalls of the recess, wherein the outer sidewalls of the top electrode are defined by the opposite conductive layer sidewalls, the opposite electrode substrate sidewalls, and the opposite electrode dielectric layer sidewalls; and
positioning the top electrode within the plasma chamber with the outer sidewalls of the top electrode laterally spaced from sidewalls of the plasma chamber.

14. The method according to claim 10, further comprising:
forming the conductive structure over a top surface of the substrate that is even with the top surface of the MEMS device;
forming the anti-stiction layer lining sidewalls of the conductive structure; and
bonding an integrated circuit to the substrate through an inter-substrate dielectric layer arranged between the integrated circuit and the substrate.

15. The method according to claim 10, wherein the electrode substrate comprises glass.

16. A method for manufacturing a microelectromechanical systems (MEMS) package, the method comprising:

providing a MEMS substrate supporting MEMS bond pads and a eutectic bonding structure, wherein the MEMS bond pads are electrically coupled to an underlying integrated circuit (IC) by through substrate vias (TSVs) extending through the MEMS substrate;

forming an anti-stiction layer covering a MEMS device arranged in the MEMS substrate, covering the MEMS bond pads and the eutectic bonding structure, and lining a cavity accommodating a movable element of the MEMS device;

patterning a top electrode to form a recess on a bottom of the top electrode, wherein the top electrode comprises a conductive layer, an electrode substrate under and contacting the conductive layer, and an electrode dielectric layer under and contacting the electrode substrate, wherein the recess is formed in the electrode dielectric layer and extending laterally to enclose a central region of the top electrode along an outer edge of the central region, and wherein the recess has a top surface that is defined by a bottom surface of the electrode substrate and the bottom surface of the electrode substrate at least partially covers the recess;

performing a plasma-based cleaning process to remove the anti-stiction layer from the MEMS bond pads and the eutectic bonding structure without removing the anti-stiction layer from the MEMS device and the cavity, wherein the plasma-based cleaning process comprises selectively generating plasma localized to a periphery of the MEMS substrate using the top electrode and an underlying bottom electrode, and subsequently exposing the MEMS substrate to the plasma; and eutectically bonding a cap substrate to the eutectic bonding structure, such that the cap substrate covers the MEMS device.

17. The method according to claim 16, further comprising:

forming the top electrode, wherein forming the top electrode comprises forming the electrode dielectric layer as photoresist and the electrode substrate as glass.

18. The method according to claim 16, wherein providing the MEMS substrate comprises:

fusion bonding the IC to the MEMS substrate through an inter-substrate dielectric layer that is arranged between the MEMS substrate and the IC; and forming the MEMS bond pads and the eutectic bonding structure laterally spaced and over a top surface of the MEMS substrate that is even with a top surface of the MEMS device.

19. The method according to claim 18, wherein patterning the top electrode comprises forming the recess with a ring shape and with the top surface of the recess extending continuously from an inner sidewall of the recess to an outer sidewall of the recess, and wherein the inner and outer sidewalls of the recess are defined by the electrode dielectric layer and underlie the top surface of the recess.

20. The method according to claim 16, wherein the bottom surface of the electrode substrate completely covers the recess when viewed in cross-section.

* * * * *